US008233278B2

(12) United States Patent
Hoffman et al.

(10) Patent No.: US 8,233,278 B2
(45) Date of Patent: Jul. 31, 2012

(54) SOLAR INVERTER CABINET ARCHITECTURE

(75) Inventors: Brian J. Hoffman, Bend, OR (US); Steven G. Hummel, Bend, OR (US); Jon Ronhaar, Terrebonne, OR (US); Andrew Olseene, Bend, OR (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 149 days.

(21) Appl. No.: 12/616,777

(22) Filed: Nov. 11, 2009

(65) Prior Publication Data

US 2010/0118488 A1 May 13, 2010

Related U.S. Application Data

(60) Provisional application No. 61/113,530, filed on Nov. 11, 2008.

(51) Int. Cl.
*H05K 7/20* (2006.01)

(52) U.S. Cl. ... 361/697; 361/623; 361/676; 361/679.47; 361/679.51; 361/695; 454/184; 165/122; 62/3.7; 62/259.2

(58) Field of Classification Search .................. 361/603, 361/620–623, 647, 663, 676–678, 679.46–679.51, 361/691, 694–697, 701–702, 830–831, 836
See application file for complete search history.

(56) References Cited

U.S. PATENT DOCUMENTS

| | | | |
|---|---|---|---|
| 5,203,989 A * | 4/1993 | Reidy | 210/137 |
| 5,493,474 A | 2/1996 | Schkrohowsky et al. | |
| 5,725,622 A | 3/1998 | Whitson et al. | |
| 6,704,196 B1 * | 3/2004 | Rodriguez et al. | 361/679.33 |
| 6,857,466 B2 | 2/2005 | Osakabe | |
| 6,931,756 B2 * | 8/2005 | Morgan et al. | 34/202 |
| 7,079,379 B2 * | 7/2006 | Yamaguchi et al. | 361/676 |
| 7,187,547 B1 | 3/2007 | French et al. | |
| 7,397,653 B2 | 7/2008 | Taylor | |
| 7,508,663 B2 | 3/2009 | Coglitore | |
| 7,593,223 B2 * | 9/2009 | Kobayashi | 361/679.5 |
| 7,929,301 B2 * | 4/2011 | Fong et al. | 361/695 |
| 7,974,094 B2 * | 7/2011 | Hendrix et al. | 361/695 |
| 2006/0104027 A1 * | 5/2006 | Vinson et al. | 361/695 |
| 2007/0188282 A1 * | 8/2007 | Folts et al. | 336/55 |
| 2007/0279863 A1 * | 12/2007 | Illerhaus | 361/695 |
| 2008/0180903 A1 | 7/2008 | Bisson et al. | |

FOREIGN PATENT DOCUMENTS

WO WO-2004040724 A2 5/2004

OTHER PUBLICATIONS

U.S. Appl. No. 12/616,779, filed Nov. 11, 2009, Fife.
International Search Report and Written Opinion for International Application No. PCT/US2009/064075, Mail Date Jan. 6, 2010, 11 pages.

* cited by examiner

*Primary Examiner* — Courtney Smith
(74) *Attorney, Agent, or Firm* — Perkins Coie LLP

(57) ABSTRACT

A cabinet for a solar power inverter is described. A solar power inverter receives DC current from a solar panel and transforms the DC current into AC current. To cool the inverter equipment, an air inlet receives ambient air drawn into the cabinet by an air pressurizer. The ambient air is urged into a pressurized air plenum, from which two ports channel the air into at least two air paths to flow over the equipment in the cabinet. The equipment in the cabinet is arranged such that the air passes over more heat-sensitive equipment before reaching less heat-sensitive equipment. The equipment in the cabinet can be separated by grounded, metal walls to contain and diminish electromagnetic interference. The equipment may be accessed from a single, front side of the cabinet.

16 Claims, 5 Drawing Sheets

SECTION A-A

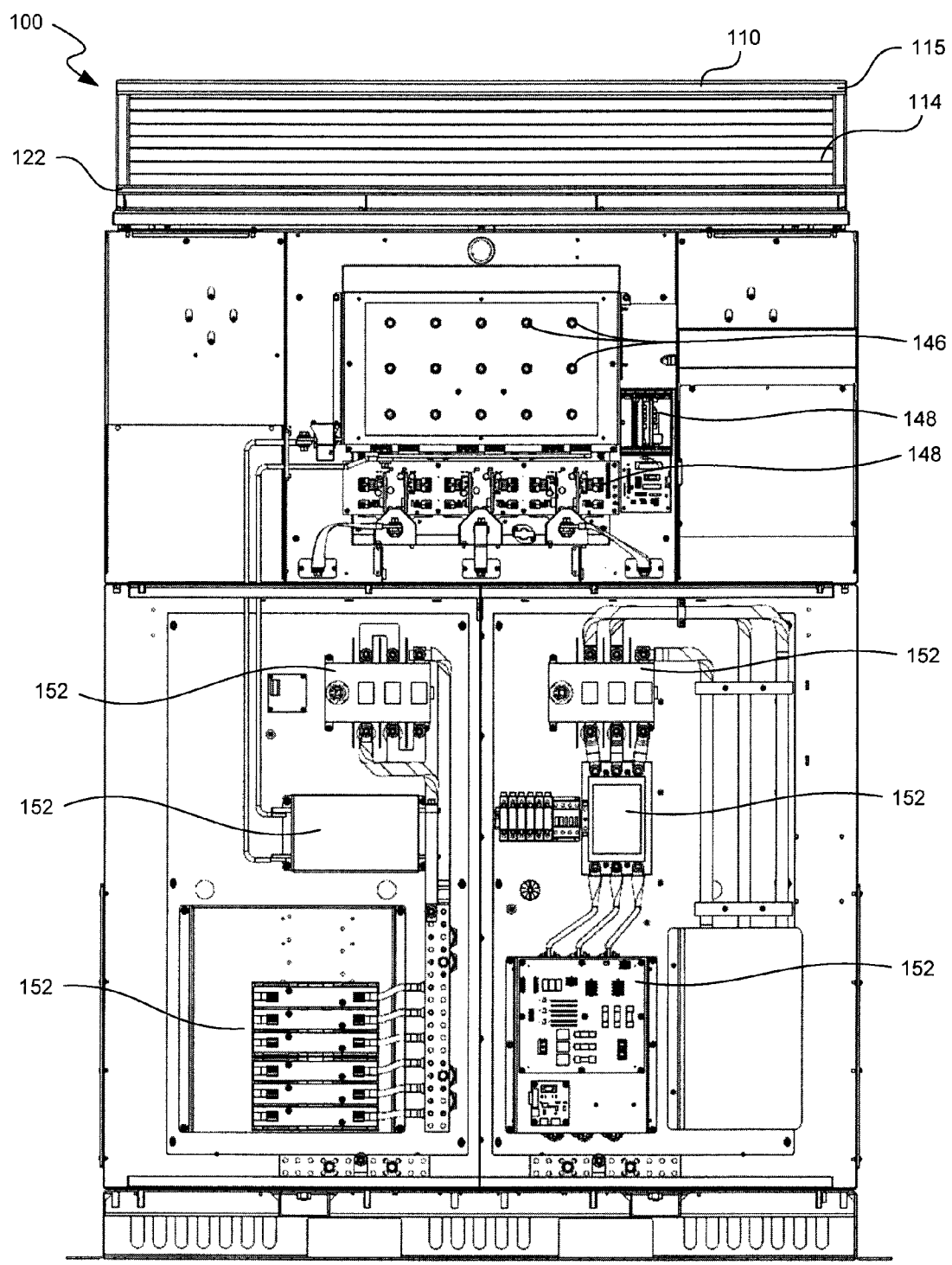
FIG. 4   SECTION B-B

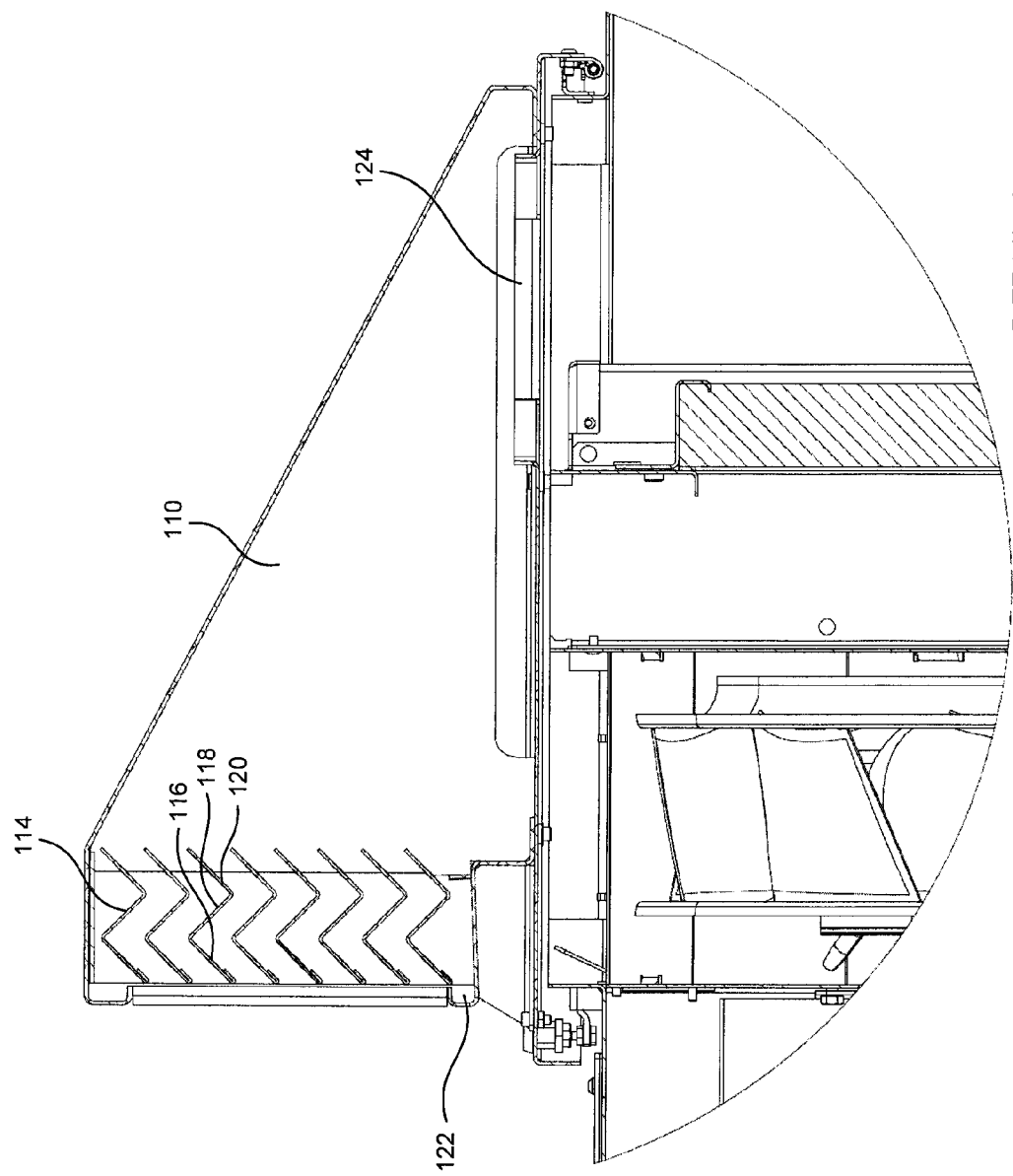

SOLAR INVERTER CABINET ARCHITECTURE

RELATED APPLICATIONS

This application claims the benefit of U.S. Provisional Application No. 61/113,530 filed Nov. 11, 2008, entitled "Solar Inverter Cabinet Architecture," which is incorporated herein in its entirety.

TECHNICAL FIELD

The present disclosure is directed generally to cabinets to house electrical inverter equipment for use with a solar panel.

BACKGROUND

Solar panel technology is improving rapidly. One area of marked improvement is the lifetime of panels. Some solar panels on the market today carry a 25 year warranty. The advantage of this longevity is hampered, however, if supporting equipment requires maintenance, replacement, or other attention before the 25 year period ends. The competitive market for energy demands that all the components of a solar panel be as durable and trouble-free as the solar panels themselves to minimize maintenance and replacement overhead.

Many solar panel installations are located in remote, harsh environments such as the deserts of the southwestern United States. A chief concern with solar power support equipment, such as power inverter cabinets, is managing the excessive heat produced by operating the equipment in addition to the natural ambient heat normally found near solar panels. A trivial solution is to use the abundantly available electrical power produced by the solar panels to run many, large fans. Doing so, however, significantly affects the amount of energy produced by the installation, and ultimately the profitability of the installation.

SUMMARY

Aspects of the present disclosure are directed generally to cabinets to house electrical equipment such as solar power inverters and associated techniques for manufacturing and assembling such cabinets. Several details describing embodiments of the disclosure are provided below. Embodiments of the present disclosure are generally directed to a cabinet for a solar power inverter, including a hood positioned at a highest point of the cabinet. The hood has an array of louvers near an air inlet and a gutter below the louvers to carry water and debris captured by the louvers out of the hood. The cabinet also includes an intake chamber below the hood and connected to a hood air outlet containing an air filter, an air pressurizer, and an air plenum. The air pressurizer can create air pressure in the intake chamber to cause air to enter the intake chamber through the hood and pass through the air filter and into the air plenum. A diversion chamber is connected to the air plenum and has a gate between the plenum and a first diversion port and a second diversion port. The cabinet also includes a first chamber connected to the air plenum at the first diversion port containing DC capacitors, control electronics, power drive electronics, and switching transistors. A second chamber below the first chamber is connected to the first chamber, and contains switch gear such as AC/DC contactors, surge suppression hardware, distribution circuitry, or other support electronics for the solar power inverter. The second chamber has a first cabinet air outlet leading out of the cabinet near a base of the cabinet.

The cabinet also includes a third chamber connected to the air plenum at the second diversion port containing a heat sink that removes heat from the switching transistors, and a fourth chamber below the third chamber that receives air from the third chamber. The fourth chamber contains a transformer and an inductor, and has a second cabinet air outlet leading out of the cabinet. The first chamber, the second chamber, the third chamber and the fourth chamber comprise grounded metal walls with openings that permit air to flow between the first and second chambers and between the third and fourth chambers. The various chambers in the cabinet can be dimensioned and arranged with minimal space between the components within the chambers and the chamber walls to improve heat management efficiency.

In other embodiments, a cabinet for a solar power inverter includes an air induction system, which includes an air inlet, an air filter, a fan, and an air plenum. The fan causes air to enter the air inlet, pass through the air filter, and enter the air plenum to pressurize the air plenum. The cabinet also includes an air diverter to divert air from the air plenum into a first air path and a second air path. The first air path reaches a compartment containing at least one of DC capacitors, control electronics, power drive electronics, or switching transistors, and then reaches a compartment containing switch gear. The second air path reaches a compartment containing a heat sink for switching transistors, and then reaches a compartment containing transformers and inductors. The air inlet is positioned at a top of the cabinet and the first and second air paths extend generally downward toward a base of the cabinet.

In still other embodiments, a solar power inverter cabinet includes an air inlet comprising a series of corrugated louvers. The louvers can be sloped toward a side of the inlet such that fluid that enters the air inlet is caught by the louvers and channeled into the gutter and out of the cabinet. The cabinet also includes a fan positioned to draw air into the air inlet and into a pressurized air plenum, which is positioned beneath the air inlet. The cabinet further includes inverter components having a high heat-sensitivity positioned near the air plenum, and inverter components having a low heat-sensitivity, with the inverter components having a high heat-sensitivity positioned between the air plenum and the components having a low heat-sensitivity such that air passes over the components having a high heat-sensitivity before reaching the components having a low heat-sensitivity.

BRIEF DESCRIPTION OF THE DRAWINGS

FIG. 4 is a partially schematic, front cross-sectional view of a solar inverter cabinet in accordance with the present disclosure.

FIG. 5 is a partially schematic, cross-sectional view of a hood for a solar power inverter in accordance with the present disclosure.

DETAILED DESCRIPTION

Figure 1:
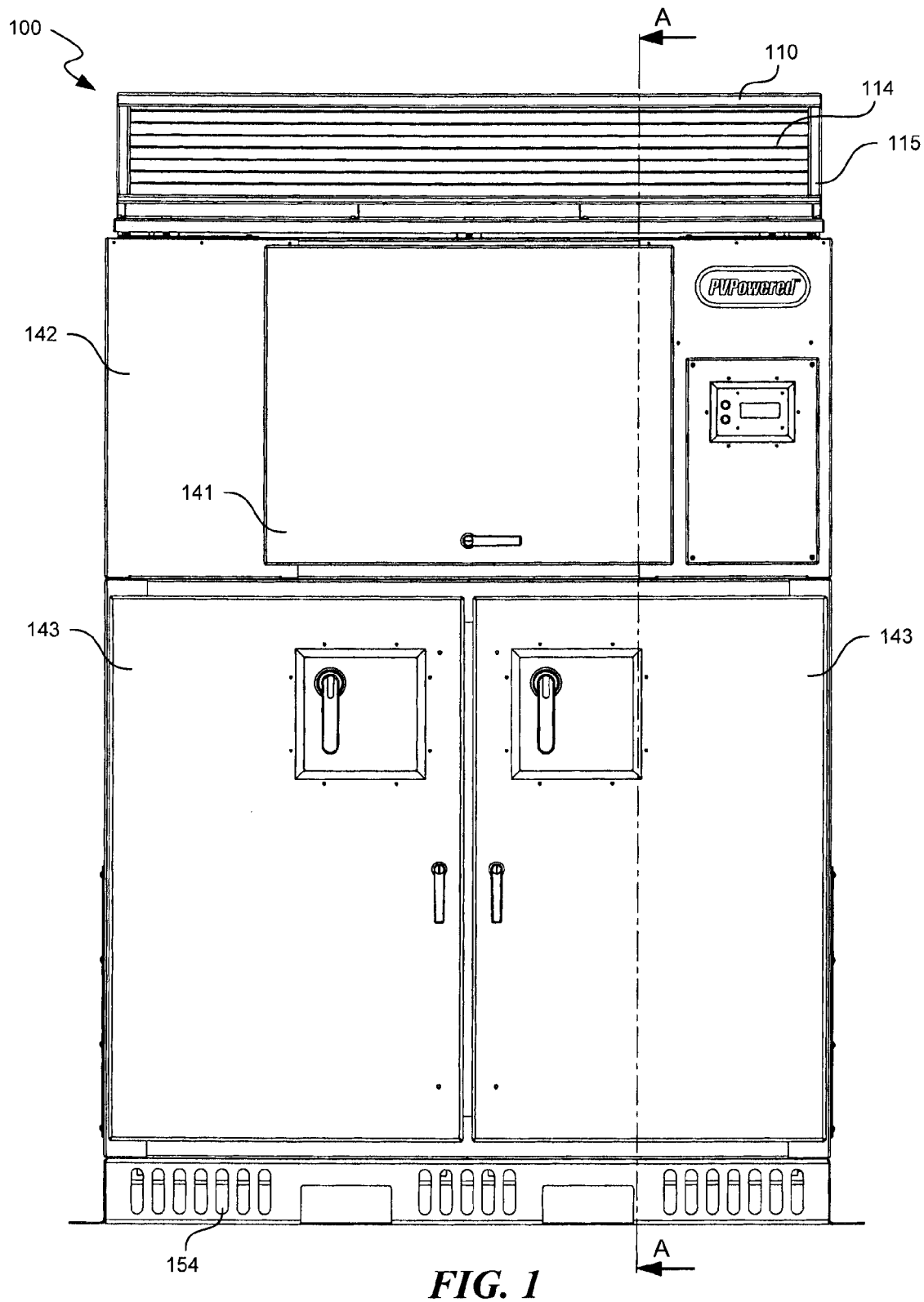
FIG. 1 is a partially schematic front view of a solar inverter cabinet in accordance with the present disclosure.
Figure 2:
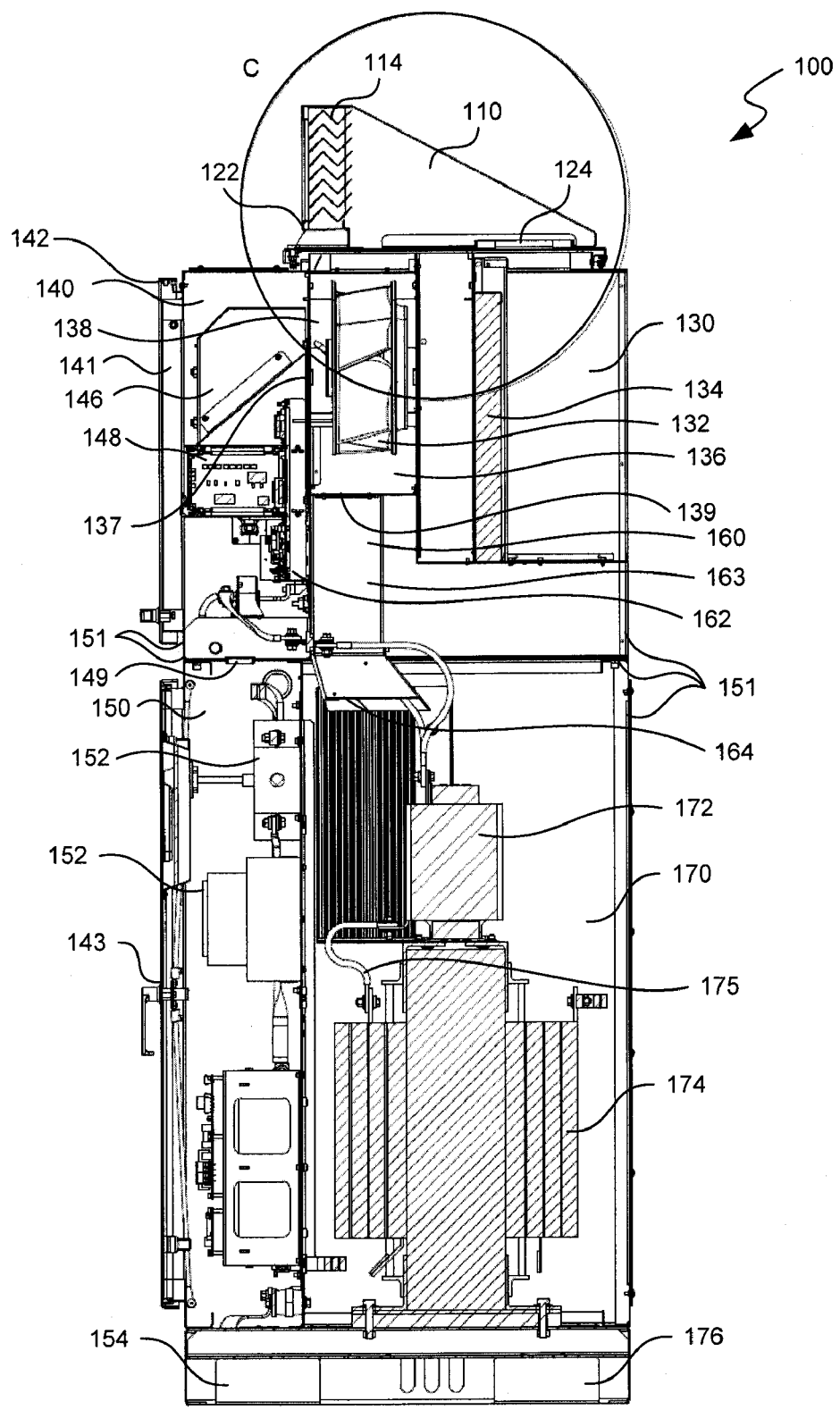
FIG. 2 is a partially schematic, side cross-sectional view of a solar power inverter in accordance with the present disclosure.
Figure 3:
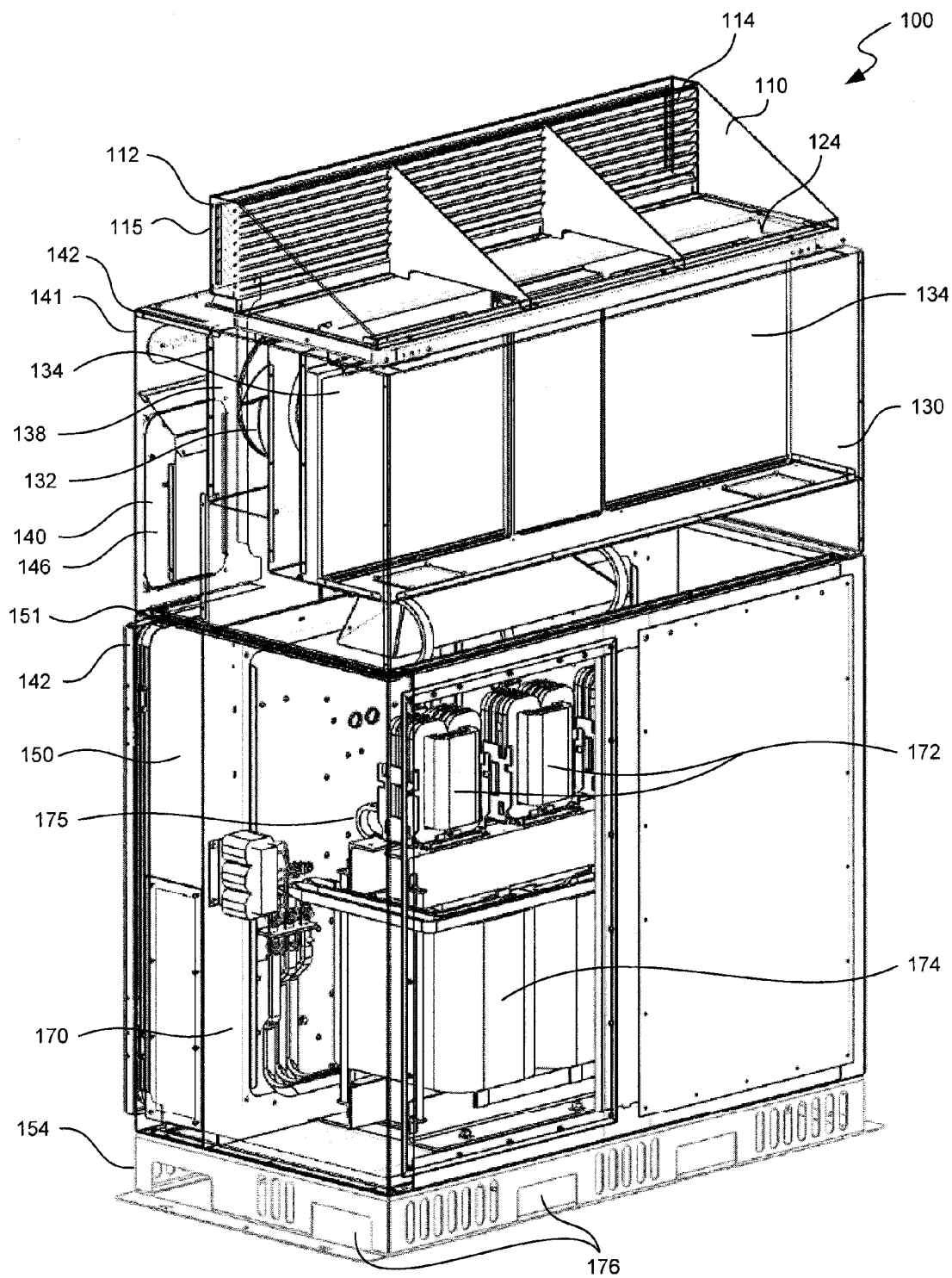
FIG. 3 is a partially schematic, isometric, semi-transparent illustration of a solar inverter cabinet in accordance with the present disclosure.

Aspects of the present disclosure are directed generally to cabinets to house electrical equipment such as solar power inverters and associated techniques for manufacturing and assembling such cabinets. Several details describing embodiments of the disclosure are provided below. Structures or processes that are well-known and often associated with the operation of solar power inverters and solar panels are not set forth in the following description for purposes of brevity. Moreover, although the following disclosure sets forth several embodiments of the invention, several other embodiments can have different configurations or different components than those described in this section. Accordingly, other embodiments may include additional elements and/or may lack one or more of the elements described below with reference to FIGS. 1-3.

FIGS. 1-5 illustrate a solar power inverter cabinet 100 containing a solar power inverter system 102 in accordance with several embodiments of the present disclosure. A solar panel or solar panel array produces electricity in the form of a DC current. Before the energy can be used by a grid, a home, a business, or another consumer, it usually must be converted into AC current. A solar power inverter 102 performs this conversion. To extract the most valuable energy from the solar panels, the inverter system 102 and other intermediary systems output a clean, noise-free AC signal.

Referring now to FIGS. 1-4, in which similar reference numbers refer to similar elements, the cabinet 100 can include an intake chamber 130 that holds an air pressurizer 132 to create an air pressure differential within the intake chamber 130. In an embodiment, the air pressurizer 132 comprises any number of axial fans, radial fans, backwards curved impellers, or centrifugal blowers. The intake chamber 130 can include other fan types or pressure sources. The pressure differential can draw the air into the hood 110, through an air filter 134, and into a pressurized air plenum 136. In some embodiments, the plenum 136 is connected to a diversion chamber 138 having a first port 137 and a second port 139. The diversion chamber 138 can distribute the air from the air plenum 136 through one or both ports 137, 139 from the diversion chamber 138. Some embodiments involve a single plenum 136, minimizing many common problems such as backflow, stagnation, and flow reversal that can occur when one fan fails out of a chain of fans. In selected embodiments, the diversion chamber 138 includes a gate that can distribute more air through the first port 137 and less air through the second port 139, or vice-versa. Alternatively, the amount of air directed through either the first port 137 or the second port 139 is independent of the amount of air directed through the other port. The ports 137, 193 can each comprise a plurality of holes or openings, which can be specifically arranged to provide advantageous air flow in the cabinet.

The cabinet 100 has a first chamber 140 that can be positioned near a front 142 of the cabinet 100. According to some embodiments, an air inlet 124 connects to the first port 137 in the diversion chamber 138 to receive air from the pressurized air plenum 136. The first chamber 140 can contain components such as DC capacitors 146 and control electronics 148 for controlling operations of the solar inverter system 102. In other embodiments, the first chamber 140 can also contain power drive electronics 148 and switching transistors 162. The air from the air plenum 136 can flow past the components in the first chamber 140 to remove excess heat produced by these components. In certain embodiments, the first port 137 from the distribution chamber 138 comprises a plurality of holes or openings arranged according to how the control electronics 148 or DC capacitors 146 are arranged. For example, at least some of the DC capacitors 146 can each have a corresponding, dedicated hole through which air reaches the DC capacitors 146.

From the first chamber 140, the air can continue to flow downward through an inlet 149 into a second chamber 150 of the cabinet 100 containing switching gear 152 and other electronic equipment for the inverter system 102. For example, the second chamber 150 can contain AC/DC contactors, distribution circuitry, surge suppression hardware, or other supporting electronics. The air flow can similarly remove excess heat from the chamber 150 by passing over the components and out of the cabinet 100 through an exit port 154. Because the temperature difference between the air in the plenum 136 and the components to be cooled is greatest when the air first enters the cabinet 100, the first chamber 140 can house components that are more heat-sensitive than other components found in the second chamber 150.

In selected embodiments, the cabinet also has a third chamber 160 that also receives air from the air plenum 136. The third chamber 160 is connected the diversion chamber 138 through the second port 139. The third chamber can contain heat-sensitive components, such a heat sink 163 used to drain heat from switching transistors 162. In some embodiments, the heat sink 163 is found directly within the plenum 136, and the third chamber 160 can be omitted. The air from the diversion chamber 138 flows over the heat sink 163 to remove heat. In selected embodiments, the switching transistors 162 are located across a boundary 151 between the first chamber 140 and the third chamber 160. The heat sink 163 can be positioned and configured to remove heat from the switching transistors 162 and into the third chamber 160. In configurations in which the heat sink 163 receives most or nearly all of the heat produced by the switching transistors 162, the air flow into the third chamber 160 can be proportionately greater in the third chamber 160 than in the first chamber 140. In other embodiments, other components can also be equipped with heat sinks which may extend into a different chamber than the chamber in which the component is found. The air flow to the respective chambers can be adjusted according to the heat load in the chamber. For example, if two components have attached heat sinks which receive most of the heat load from the component, and if the components bridge a chamber boundary 151 with the heat sink on one side and the component on the other side, the heat sinks can be positioned on the same side of the boundary 151 in the same air flow which can be proportionately larger than the air flow to the components. In other embodiments, the heat sinks can be found on opposite sides of the boundary 151 to more evenly spread the heat between the air flows.

From the third chamber 160, the air continues to flow into a fourth chamber 170 through an inlet 164. The fourth chamber 170 can contain components that are less susceptible to damage from heat, such as output filter elements inductor 172 and transformer 174. (In other embodiments, the output filter can be formed using a combination of inductors, capacitors, and resistors.) In some embodiments, the inductor 172 is placed directly above and near the transformer 174 before connecting to the outgoing AC circuitry. This placement allows a connector 175 to be relatively short. Placing the transformer 174 underneath the inductor 172 with a relatively short connector 175 minimizes the length of the connector 175, reducing conduction losses and making the connector 175 less likely to pick up or transmit electromagnetic noise and interference (EMI). From the fourth chamber 170, the air can exit the cabinet 100 through a frontal exit port 154 or through a rear exit port 176. Accordingly, the first chamber 140 and second chamber 150 define a first air path through the cabinet 100, and the third chamber 160 and fourth chamber 170 define a second air path through the cabinet. The diversion chamber 138 can be used to distribute more or less air into the first air path or into the second air path according to the needs of components along the respective air paths. The cabinet 100 may use temperature control techniques described in U.S. patent application Ser. No. 12/616,779, entitled, "TEMPERATURE CONTROL ALGORITHMS FOR HIGH RELIABILITY SOLAR POWER INVERTERS," invented by John Michael Fife and Steve Hummel, filed Nov. 11, 2009, which is incorporated herein by reference in its entirety.

The first chamber 140 and the second chamber 150 can each include at least one access panel 141, 143 to provide access to the components within the chambers 140, 150. In some embodiments, the components in the first chamber 140 and the second chamber 150 are components that may be accessed from time to time, whereas components in the third chamber 160 and the fourth chamber 170 are components which do not require frequent access. This arrangement provides many benefits. For example, a technician need not reach around the back or sides of the unit to service the unit to access the inverter 102. Also, the National Electric Code (NEC) requirements specify that inverter cabinets must allow at least three feet of space in front of an access panel. A cabinet which allows access on more than one side occupies more floor space because the NEC requirements demand three feet of space in at least two directions. In contrast, cabinets constructed in accordance with the present disclosure need only provide three feet to one side (e.g., the front) of the cabinet, saving valuable floor space.

In an embodiment of the disclosure, the chambers of the cabinet 100 are constructed of grounded metal walls 151 to isolate and reduce the EMI naturally present during operation. By isolating components of the solar inverter into separate chambers 130, 138, 140, 150, 160, 170, the EMI in the cabinet can be minimized and kept from interfering with the stable operation of the inverter 102. Reducing the EMI also eliminates noise from the output signal to provide a higher quality power output from the inverter 102. In some embodiments, because the cabinet 100 is partitioned by the grounded walls 151, the different chambers 130, 138, 140, 150, 160, 170 can be constructed separately into modules, from which a cabinet 100 can be assembled. For repair or maintenance, the modules may be replaced or changed individually.

In accordance with the present disclosure, the components within the cabinet 100 can be effectively cooled using less power than conventional cooling techniques, because rather than tapping deeply into the electrical power produced by the solar panels to power large fans, the structure and layout of the cabinet 100 uses a deliberate approach to air distribution according to heat-sensitivity. The difference between the airflow temperature and the components being cooled by the airflow temperature directly affects the amount of heat the airflow can remove from the components. The cold, fresh air coming directly from the air plenum can be channeled to more heat-sensitive components before moving on to less heat-sensitive components. In particular embodiments, the switching transistors 162 and associated heat sink 163 in the third chamber 160 generate more heat, and are more heat-sensitive, than other components farther from the plenum 136. Once the air passes into the fourth chamber 170 it carries some heat from the heat sink 163 and is therefore less effective at cooling the inductor 172 and transformer 174 than air directly from the plenum. However, the transformer 172 and inductor 174 are less at risk for damage from excess heat, and may also produce far less heat, and so the diminished effectiveness of the airflow in the fourth chamber 170 has been anticipated and does not create a risk. A similar situation can be found in the first chamber 140 and the second chamber 150, where the more heat-sensitive components are found in the first chamber 140, which accordingly receives the coldest air from the plenum. The foregoing discussion has used DC capacitors 146, power drive electronics 148 switch gear 152, switching transistors 162, inductors 172 and transformers 174 as examples of components for a solar power inverter 102. Other embodiments include other components in the chambers 140, 150, 160, 170, and include other suitable numbers of chambers. The dimensions of the cabinet 100 and the chambers and components within the cabinet 100 have been chosen merely for illustrative purposes and not to limit the scope of the disclosure.

FIG. 5 is an illustration of a hood 110 in accordance with several embodiments of the present disclosure. In particular embodiments, the hood 110 is located near the top of the cabinet 100. In many environments, ambient air is cooler and cleaner farther from the ground. To take full advantage of the colder, cleaner air, the hood 110 can be positioned a the highest point of the cabinet 100. To take advantage of this cold, clean air, several embodiments of the cabinet 100 described herein include a "top-down" design, where the air passes from the hood 110, down into various chambers in the cabinet and toward a base of the cabinet 100. The hood 110 contains a series of louvers 114 which can be corrugated to prevent water and other debris from passing beyond the louvers 114. In specific embodiments, the louvers 114 can include an upwardly slanting portion 116, a downwardly slanting portion 118, and a second upwardly slanting portion 120 to create a tortuous path to prevent water and debris from passing beyond the louvers 114. The louvers 114 can be sloped toward a side 115 of the hood 110 (shown to greater advantage in FIG. 3). The hood 110 can also contain a gutter 122 that channels water and other debris out of the hood 110. The hood 110 is connected to other chambers in the cabinet 100 through an outlet 124 that can be positioned at the rear of the hood 110. In some embodiments, the hood 110 can comply with various standards for moisture and debris protection, such as put forth by the National Electrical Manufacturers Association (NEMA) standards. For example, a NEMA 4 rating generally means the hood 110 is watertight, or weatherproof, meaning it must exclude at least 65 gallons per minute of water from a one-inch nozzle delivered from a distance not less than ten feet for five minutes. In other embodiments, the inlet protects against corrosion, wind-blown dust and rain, splashing water, hose-directed water, and damage from external ice formation.

From the foregoing, it will be appreciated that specific embodiments of the disclosure have been described herein for purposes of illustration, but that various modifications may be made without deviating from the disclosure. For example, while the foregoing embodiments were described generally in the context of an electrical inverter for a solar panel, the foregoing techniques and systems may be used to build structures other than inverter cabinets.

Certain aspects of the embodiments described above may be combined or eliminated in other embodiments. While advantages associated with certain embodiments have been described in the context of those embodiments, other embodiments may also exhibit such advantages, and not all embodiments need necessarily exhibit such advantages to fall in the scope of the present disclosure. Accordingly, the disclosure can include other embodiments not expressly shown or described above. The following examples provide additional embodiments of the disclosure.

The invention claimed is:

1. A cabinet for a solar power inverter, comprising:
a hood positioned at a highest point of the cabinet, the hood having an array of louvers near an air inlet and a gutter below the louvers to carry fluid that enters the air inlet out of the hood, the hood having a hood air outlet;
an intake chamber below the hood and connected to the hood air outlet, the intake chamber containing an air filter, an air pressurizer, and an air plenum, the air pressurizer creating air pressure in intake chamber to cause air to enter the intake chamber through the hood and pass through the air filter and into the air plenum;
a diversion chamber connected to the air plenum and having a gate between the plenum and a first diversion port and a second diversion port;
a first chamber connected to the air plenum at the first diversion port, the first chamber containing DC capacitors, control electronics, and switching transistors, the first chamber having a first chamber air outlet;
a second chamber below the first chamber connected to the first chamber air outlet, the second chamber containing switch gear and support electronics for the solar power inverter, the second chamber having a first cabinet air outlet leading out of the cabinet near a base of the cabinet;
a third chamber connected to the air plenum at the second diversion port, the third chamber containing a heat sink for the switching transistors and having a third chamber air outlet; and
a fourth chamber below the third chamber connected to the third chamber air outlet, the fourth chamber containing a transformer and an inductor, and having a second cabinet air outlet leading out of the cabinet, wherein the first chamber, the second chamber, the third chamber and the fourth chamber comprise grounded metal walls with openings that permit air to flow between the first and second chambers and between the third and fourth chambers.

2. The cabinet of claim 1 wherein the cabinet has a front, the cabinet further comprising at least a first access panel to the first chamber and a second access panel to the second chamber, the first and second access panels being positioned on the front of the cabinet.

3. The cabinet of claim 1 wherein the second chamber also contains support electronics such as at least one of AC/DC contactors, surge suppression hardware, or distribution circuitry.

4. The cabinet of claim 1 wherein the third chamber contains a heat sink configured to receive heat from the switching transistors, and wherein the switching transistors and the heat sink bridges a boundary between the first chamber and the second chamber with the switching transistors in the first cabinet and the heat sink in the third cabinet.

5. The cabinet of claim 1 wherein at least one of the first diversion port and the second diversion port comprises a plurality of openings to permit air to flow from the diversion chamber.

6. The cabinet of claim 5 wherein the plurality of openings in the first diversion port are arranged according to components within the first chamber, and wherein the plurality of openings in the second diversion port are arranged according to components within the third chamber.

7. The cabinet of claim 1 wherein the gate distributes air between the first diversion port and the second diversion port.

8. The cabinet of claim 7 wherein the control electronics are configured to distribute air between the first port and the second port according to a priority based, at least in part, upon a heat sensitivity of components within the first, second, third, and fourth chambers.

9. The cabinet of claim 1 wherein the first chamber, the second chamber, the third chamber, and the fourth chamber comprise replaceable modules.

10. The cabinet of claim 1 wherein the cabinet houses a solar power inverter configured to receive a DC current from a solar panel and convert the DC current into an AC current.

11. The cabinet of claim 1 wherein the first chamber, the second chamber, the third chamber, and the fourth chamber are sized with chamber walls near components within the first, second, third, and fourth chambers such that dead air space within the first, second, third, and fourth chambers is minimal.

12. A cabinet for a solar power inverter, comprising:
an air induction system comprising—
an air inlet;
an air filter;
a fan; and
an air plenum, wherein the fan causes air to enter the air inlet, pass through the air filter, and enter the air plenum to pressurize the air plenum;
an air diverter to divert air from the air plenum into a first air path and a second air path, wherein the first air path reaches a compartment containing DC capacitors and control electronics, and then reaches a compartment containing switch gear, and wherein the second air path reaches a compartment containing a heat sink, and then reaches a compartment containing transformers and inductors; and
wherein the air inlet is positioned at a top of the cabinet and the first and second air paths extend generally downward toward a base of the cabinet.

13. The cabinet of claim 12 wherein the compartment containing DC capacitors and control electronics and the compartment containing switch gear are positioned at a front of the cabinet and include an access panel.

14. The cabinet of claim 12 wherein the hood excludes at least 65 gallons per minute of water from a one-inch nozzle delivered from a distance not less than ten feet for at least five minutes.

15. The cabinet of claim 12 wherein the air diverter can augment or reduce an amount of air delivered to the first air path and to the second air path, and wherein the amount of air is adjusted according to a control routine running on the control electronics.

16. The cabinet of claim 15 wherein the control routine is based, at least in part, upon a relative heat sensitivity of the DC capacitors, the control electronics, the switching transistors, the transformer, and the inductor.

* * * * *